(12) United States Patent
Kurosu

(10) Patent No.: US 12,125,373 B2
(45) Date of Patent: Oct. 22, 2024

(54) CABLE ERRONEOUS DISCONNECTION PREVENTION SYSTEM, MANAGEMENT APPARATUS, CABLE ERRONEOUS DISCONNECTION PREVENTION METHOD, AND PROGRAM

(71) Applicant: NEC Corporation, Tokyo (JP)

(72) Inventor: Kouichi Kurosu, Tokyo (JP)

(73) Assignee: NEC CORPORATION, Tokyo (JP)

( * ) Notice: Subject to any disclaimer, the term of this patent is extended or adjusted under 35 U.S.C. 154(b) by 362 days.

(21) Appl. No.: 17/627,957

(22) PCT Filed: Jul. 17, 2020

(86) PCT No.: PCT/JP2020/027804
§ 371 (c)(1),
(2) Date: Jan. 18, 2022

(87) PCT Pub. No.: WO2021/015118
PCT Pub. Date: Jan. 28, 2021

(65) Prior Publication Data
US 2022/0254248 A1    Aug. 11, 2022

(30) Foreign Application Priority Data
Jul. 19, 2019  (JP) ................................. 2019-133356

(51) Int. Cl.
*G08C 23/04*    (2006.01)
*G08B 21/18*    (2006.01)

(52) U.S. Cl.
CPC ........... *G08C 23/04* (2013.01); *G08B 21/185* (2013.01)

(58) Field of Classification Search
CPC ...... G08C 23/04; G08B 21/185; G01R 31/55; H02G 1/00; H02G 1/06; H04B 10/116
See application file for complete search history.

(56) References Cited

U.S. PATENT DOCUMENTS 7,312,715 B2 * 12/2007 Shalts ...................... H04Q 1/06
361/679.41
9,185,010 B2 * 11/2015 Torigoe ................... H04L 41/12
(Continued)

FOREIGN PATENT DOCUMENTS

JP    2006-054118 A    2/2006
JP       3938519 B2 *  6/2007
(Continued)

OTHER PUBLICATIONS

International Search Report for PCT Application No. PCT/JP2020/027804, mailed on Sep. 29, 2020.
(Continued)

*Primary Examiner* — Adnan Aziz

(57) ABSTRACT

A system comprises: electronic apparatuses; a management apparatus comprising a connection positional relation database for managing connection positional relations of the ports of the electronic apparatus; and an information communication terminal. The management apparatus acquires disconnection target port information from the information communication terminal and thereby reads information related to the disconnection target port from the connection positional relation database to transmit to the electronic apparatus. The electronic apparatus transmits a visible light signal to outside based on the information related to the disconnection target port. The information communication terminal displays the information related to the disconnection target port based on the visible light signal.

5 Claims, 8 Drawing Sheets

(56) References Cited

U.S. PATENT DOCUMENTS

| | | | |
|---|---|---|---|
| 2002/0032885 A1* | 3/2002 | Dai | G06F 11/326 |
| | | | 714/E11.186 |
| 2004/0264112 A1* | 12/2004 | Koehler | H05K 7/1498 |
| | | | 361/600 |
| 2005/0232629 A1* | 10/2005 | Amemiya | H04Q 11/0005 |
| | | | 398/45 |
| 2012/0281509 A1 | 11/2012 | Liang et al. | |
| 2013/0024563 A1* | 1/2013 | Torigoe | H04L 49/15 |
| | | | 709/224 |
| 2015/0356041 A1* | 12/2015 | Barnur | G06F 13/4022 |
| | | | 710/104 |
| 2016/0036662 A1 | 2/2016 | Shirakawa et al. | |
| 2016/0127313 A1* | 5/2016 | Balasubramanian | H04L 41/12 |
| | | | 709/220 |
| 2019/0279484 A1* | 9/2019 | Ke | G06F 11/006 |
| 2020/0313774 A1* | 10/2020 | Murakami | H04B 10/116 |
| 2021/0191056 A1* | 6/2021 | Ikuma | G06F 11/3438 |
| 2022/0255812 A1* | 8/2022 | Okabe | G06K 7/1413 |

FOREIGN PATENT DOCUMENTS

| | | |
|---|---|---|
| JP | 2010-010997 A | 1/2010 |
| JP | 2010-074938 A | 4/2010 |
| JP | 2011-205448 A | 10/2011 |
| JP | 2012-113872 A | 6/2012 |
| JP | 2012-247700 A | 12/2012 |
| JP | 2013-007934 A | 1/2013 |
| JP | 5251325 B | 7/2013 |
| JP | 5304457 8 | 10/2013 |
| JP | 2016-035697 A | 3/2016 |
| JP | 2019-219471 A | 12/2019 |
| JP | 2020-194617 A | 12/2020 |

OTHER PUBLICATIONS

JP Office Communication for JP Application No. 2021-533998, mailed on Mar. 28, 2023 with English Translation.

\* cited by examiner

FIG. 4 [OPERATIONS BEFORE DISCONNECTING CABLE FROM FIRST ELECTRONIC APPARATUS]

FIG. 5 [OPERATIONS BEFORE DISCONNECTING CABLE FROM SECOND ELECTRONIC APPARATUS]

CABLE ERRONEOUS DISCONNECTION PREVENTION SYSTEM, MANAGEMENT APPARATUS, CABLE ERRONEOUS DISCONNECTION PREVENTION METHOD, AND PROGRAM

DESCRIPTION OF RELATED APPLICATION

This is a national stage of International Application No. PCT/JP2020/027804 filed Jul. 17, 2020, claiming priority based on Japanese Patent Application No. 2019-133356 filed Jul. 19, 2019, the entire contents of which are incorporated herein by reference.

The present invention relates to a cable erroneous disconnection prevention system, a management apparatus, a cable erroneous disconnection prevention method, and program.

FIELD

Background

With increasing integration of electronic apparatus such as communication apparatus, a large number of cables are becoming to be connected to one electronic apparatus, and a large number of cables are becoming to be laid around it. In a case where the cable connection between electronic apparatuses is selectively disconnected from the electronic apparatus, it is common practice to disconnect one end of a target cable from one electronic apparatus; visually trace the target cable from the disconnected one end; and disconnect the other end of the target cable from the other electronic apparatus.

Also, cables are often laid in a building over a long distance, and both ends of the cable may be laid over different floors or rooms in the building. In a case of selectively disconnecting a long-distance cable from an electronic apparatus, it is difficult to visually trace the cable in a situation where a large number of cables are laid, so it is also practiced to selectively disconnect cables from electronic apparatuses by attaching labels with the same identification information to both ends of the cables and being able to identify the cables.

However, in a situation to attach a label to each of a large number of cables, it is likely to make a mistake in checking the label, and there is a possibility to lead to a cable erroneous disconnection.

Therefore, as a technique for preventing a cable erroneous disconnection, for example, Patent Literature (PTL) 1 discloses an optical fiber cable that comprises an LED (Light Emitting Diode) and an electric contact to each of optical connectors provided at both ends of the optical fiber cable and comprises an electrical wiring outputting a voltage input to one of the electric contacts to both of the LEDs.

Also, PTL 2 discloses a cable search method for identifying a cable by giving a physical vibration to the cable that is desired to be identified due to contact the cable and detecting the vibration from the plurality of cables by a vibration detecting means.

[PTL 1] JP5251325B
[PTL 2] JP2010-74938A

SUMMARY

The following analysis is given by the inventors of the present application.

However, since the optical fiber cable described in PTL 1 can be used only for an electronic apparatus having ports suitable for a connector with electric contacts, the usable situation is considerably limited as compared with a general cable.

Also, in the cable search method described in PTL 2, since a plurality of cables are often bundled with a binding band in an actual field, the vibration given to the cable that is desired to be identified is transmitted to other cables and cannot be detected correctly to be misrecognized in reality, as a result, there is a possibility of resulting in an erroneous disconnection.

It is a main subject of the present invention to provide a cable erroneous disconnection prevention system, a management apparatus, a cable erroneous disconnection prevention method and a program which can contribute to preventing a cable erroneous disconnection even in a situation where a general cable is used or a plurality of cables are bundled.

A cable erroneous disconnection prevention system according to a first aspect comprises: electronic apparatuses each comprising a plurality of ports that can be connected to a cable; a management apparatus that is communicably connected to the electronic apparatuses and comprises a connection positional relation database for managing connection positional relations of the ports of the electronic apparatuses; and an information communication terminal that is communicably connected to the management apparatus and comprises a display part that displays information acquired from the management apparatus, wherein the management apparatus comprises a control part that processes to: acquire disconnection target port information that directly or indirectly identifies a disconnection target port from which a cable is subjected to disconnection, from the information communication terminal or the electronic apparatus; thereby identify the disconnection target port based on the disconnection target port information; read information related to the specified disconnection target port from the connection positional relation database; and transmit the read information related to the disconnection target port to the electronic apparatus, wherein the electronic apparatus comprises a visible light transmission part that transmits a visible light signal to outside based on the information related to the disconnection target port by acquiring the information related to the disconnection target port from the management apparatus, and wherein the information communication terminal comprises a visible light reception part that can receive the visible light signal from the visible light transmission part of the electronic apparatus and causes the display part to display the information related to the disconnection target port based on the visible light signal by acquiring the visible light signal.

A management apparatus according to a second aspect is a management apparatus in a cable erroneous disconnection prevention system comprising: electronic apparatuses each comprising a plurality of ports that can be connected to a cable; the management apparatus that is communicably connected to the electronic apparatuses and comprises a connection positional relation database for managing connection positional relations of the ports of the electronic apparatuses; and an information communication terminal that is communicably connected to the management apparatus and comprises a display part that displays information acquired from the management apparatus, wherein the management apparatus comprises a control part, and wherein the control part executes processings of: acquiring disconnection target port information that directly or indirectly identifies a disconnection target port from which a cable is subjected to disconnection, from the information communication terminal or the electronic apparatus; thereby identifying the disconnection target port based on the disconnection target port information; reading information related to the specified disconnection target port from the connection positional relation database; and transmitting the read information related to the disconnection target port to the electronic apparatus.

A cable erroneous disconnection prevention method according to a third aspect is a cable erroneous disconnection prevention method performed in a cable erroneous disconnection prevention system comprising: electronic apparatuses each comprising a plurality of ports that can be connected to a cable; a management apparatus that is communicably connected to the electronic apparatuses and comprises a connection positional relation database for managing connection positional relations of the ports of the electronic apparatuses; and an information communication terminal that is communicably connected to the management apparatus and comprises a display part that displays information acquired from the management apparatus, wherein the method comprises: in the management apparatus, acquiring disconnection target port information that directly or indirectly identifies a disconnection target port from which a cable is subjected to disconnection, from the information communication terminal or the electronic apparatus; in the management apparatus, thereby identifying the disconnection target port based on the disconnection target port information; in the management apparatus, reading information related to the specified disconnection target port from the connection positional relation database; in the management apparatus, transmitting the read information related to the disconnection target port to the electronic apparatus; in the electronic apparatus, transmitting a visible light signal to outside based on the information related to the disconnection target port by acquiring the information related to the disconnection target port from the management apparatus; and in the information communication terminal, causing to display the information related to the disconnection target port based on the visible light signal by acquiring the visible light signal from the electronic apparatus.

A program according to a fourth aspect is a program executed by a management apparatus in a cable erroneous disconnection prevention system comprising: electronic apparatuses each comprising a plurality of ports that can be connected to a cable; the management apparatus that is communicably connected to the electronic apparatuses and comprises a connection positional relation database for managing connection positional relations of the ports of the electronic apparatuses; and an information communication terminal that is communicably connected to the management apparatus and comprises a display part that displays information acquired from the management apparatus, wherein the program causes the management apparatus to execute processings of: acquiring disconnection target port information that directly or indirectly identifies a disconnection target port from which a cable is subjected to disconnection, from the information communication terminal or the electronic apparatus; thereby identifying the disconnection target port based on the disconnection target port information; reading information related to the specified disconnection target port from the connection positional relation database; and transmitting the read information related to the disconnection target port to the electronic apparatus.

The program can be recorded on a computer-readable storage medium. The storage medium may be a non-transient one such as a semiconductor memory, a hard disk, a magnetic recording medium, or an optical recording medium. Also, in the present disclosure, it is also possible to implement it as a computer program product. The program is input to a computer apparatus from an input device or from outside via a communication interface; is stored in a storage device; causes a processor to drive according to predetermined steps or processings; can cause to display processing results thereof, including an intermediate state via a display device step by step as necessary; or can cause to communicate with outside via a communication interface. The computer apparatus for that purpose typically comprises: for example, a processor; a storage device; an input device; a communication interface; and, if necessary, a display device, that can be connected to each other via a bus.

According to the first to fourth aspects, it is possible to contribute to preventing a cable erroneous disconnection even in a situation where a general cable is used or a plurality of cables are bundled.

PREFERRED MODES

Figure 1:
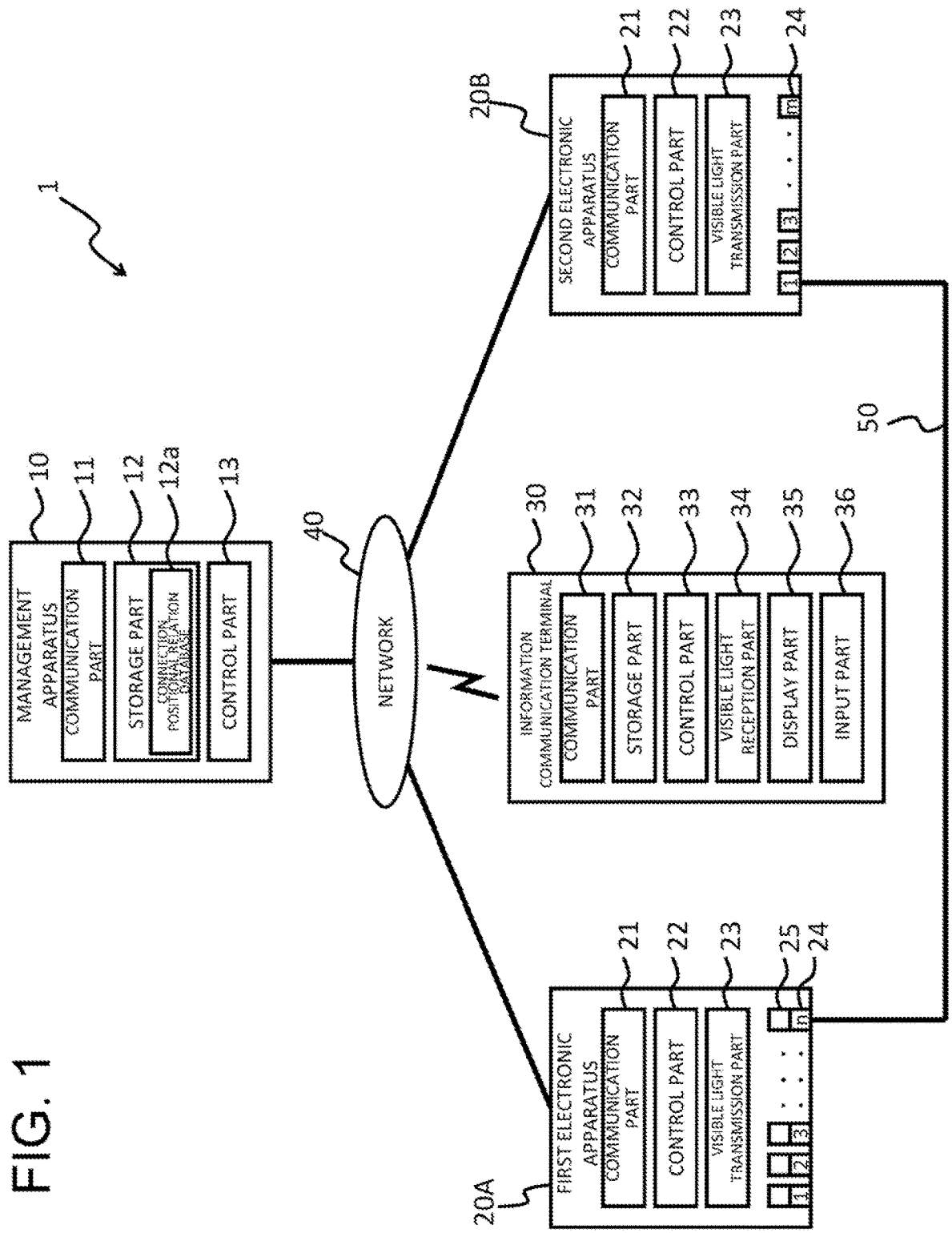
FIG. 1 is a block diagram schematically showing a configuration of a cable erroneous disconnection prevention system according to a first example embodiment.

In the present disclosure described below, a cable erroneous disconnection prevention system according to Mode 1 and modification modes thereof can be appropriately selected and combined.

As a cable erroneous disconnection prevention system according to Mode 1, it is possible to configure so that a cable erroneous disconnection prevention system comprises: electronic apparatuses each comprising a plurality of ports that can be connected to a cable; a management apparatus that is communicably connected to the electronic apparatuses and comprises a connection positional relation database for managing connection positional relations of the ports of the electronic apparatuses; and an information communication terminal that is communicably connected to the management apparatus and comprises a display part that displays information acquired from the management apparatus, wherein the management apparatus comprises a control part that processes to: acquire disconnection target port information that directly or indirectly identifies a disconnection target port from which a cable is subjected to disconnection, from the information communication terminal or the electronic apparatus; thereby identify the disconnection target port based on the disconnection target port information; read information related to the specified disconnection target port from the connection positional relation database; and transmit the read information related to the disconnection target port to the electronic apparatus, wherein the electronic apparatus comprises a visible light transmission part that transmits a visible light signal to outside based on the information related to the disconnection target port by acquiring the information related to the disconnection target port from the management apparatus, and wherein the information communication terminal comprises a visible light reception part that can receive the visible light signal from the visible light transmission part of the electronic apparatus and causes the display part to display the information related to the disconnection target port based on the visible light signal by acquiring the visible light signal.

As a modified mode of the cable erroneous disconnection prevention system according to Mode 1, it is possible to configure so that the control part of the management apparatus generates a control signal for blinking a light emitting element of the specified disconnection target port and transmits the generated control signal to the electronic apparatus, and the electronic apparatus comprises a light emitting element corresponding to the port and blinking based on the control signal by acquiring the control signal from the management apparatus.

As a modified mode of the cable erroneous disconnection prevention system according to Mode 1, it is possible to configure so that the disconnection target port information is information input by the information communication terminal or a trap at the time of link down from the electronic apparatus.

In the present disclosure, as a management apparatus according to Mode 2, it is possible to configure so that a management apparatus in a cable erroneous disconnection prevention system comprising: electronic apparatuses each comprising a plurality of ports that can be connected to a cable; the management apparatus that is communicably connected to the electronic apparatuses and comprises a connection positional relation database for managing connection positional relations of the ports of the electronic apparatuses; and an information communication terminal that is communicably connected to the management apparatus and comprises a display part that displays information acquired from the management apparatus, wherein the management apparatus comprises a control part, and wherein the control part executes processings of: acquiring disconnection target port information that directly or indirectly identifies a disconnection target port from which a cable is subjected to disconnection, from the information communication terminal or the electronic apparatus; thereby identifying the disconnection target port based on the disconnection target port information; reading information related to the specified disconnection target port from the connection positional relation database; and transmitting the read information related to the disconnection target port to the electronic apparatus.

In the present disclosure, as a cable erroneous disconnection prevention method according to Mode 3, it is possible to configure so that a cable erroneous disconnection prevention method performed in a cable erroneous disconnection prevention system comprising electronic apparatuses each comprising a plurality of ports that can be connected to a cable; a management apparatus that is communicably connected to the electronic apparatuses and comprises a connection positional relation database for managing connection positional relations of the ports of the electronic apparatuses; and an information communication terminal that is communicably connected to the management apparatus and comprises a display part that displays information acquired from the management apparatus, comprises: in the management apparatus, acquiring disconnection target port information that directly or indirectly identifies a disconnection target port from which a cable is subjected to disconnection, from the information communication terminal or the electronic apparatus; in the management apparatus, thereby identifying the disconnection target port based on the disconnection target port information; in the management apparatus, reading information related to the specified disconnection target port from the connection positional relation database; in the management apparatus, transmitting the read information related to the disconnection target port to the electronic apparatus; in the electronic apparatus, transmitting a visible light signal to outside based on the information related to the disconnection target port by acquiring the information related to the disconnection target port from the management apparatus; and in the information communication terminal, causing to display the information related to the disconnection target port based on the visible light signal by acquiring the visible light signal from the electronic apparatus.

In the present disclosure, as a program according to Mode 4, it is possible to configure so that a program executed by a management apparatus in a cable erroneous disconnection prevention system comprising: electronic apparatuses each comprising a plurality of ports that can be connected to a cable; the management apparatus that is communicably connected to the electronic apparatuses and comprises a connection positional relation database for managing connection positional relations of the ports of the electronic apparatuses; and an information communication terminal that is communicably connected to the management apparatus and comprises a display part that displays information acquired from the management apparatus, causes the management apparatus to execute processings of: acquiring disconnection target port information that directly or indirectly identifies a disconnection target port from which a cable is subjected to disconnection, from the information communication terminal or the electronic apparatus; thereby identifying the disconnection target port based on the disconnection target port information; reading information related to the specified disconnection target port from the connection positional relation database; and transmitting the read information related to the disconnection target port to the electronic apparatus.

Hereinafter, example embodiments will be described with reference to drawings. In a case where drawing-reference signs are attached in the present application, they are solely for the purpose of assisting understanding, and are not intended to be limited to the illustrated modes. Also, the following example embodiments are merely examples, and do not limit the present invention. Further, connecting lines between blocks such as drawings referred to in the following description includes both bidirectional and unidirectional. A one-way arrow schematically shows a flow of a main signal (data), and does not exclude bidirectional. Furthermore, in circuit diagrams, block diagrams, internal configuration diagrams, connection diagrams, etc. shown in the disclosure of the present application, although explicit disclosure is omitted, an input port and an output port exist at the input end and the output end of each connection line, respectively. The same applies to the input/output interface. A program is executed via a computer apparatus, which comprises, for example, a processor, a storage device, an input device, a communication interface, and a display device as required, and the computer apparatus is configured to be able to communicate with inside device(s) or external apparatus(es) (including computer(s)) via a communication interface regardless of whether it is wired or wireless.

First Example Embodiment

Figure 2:
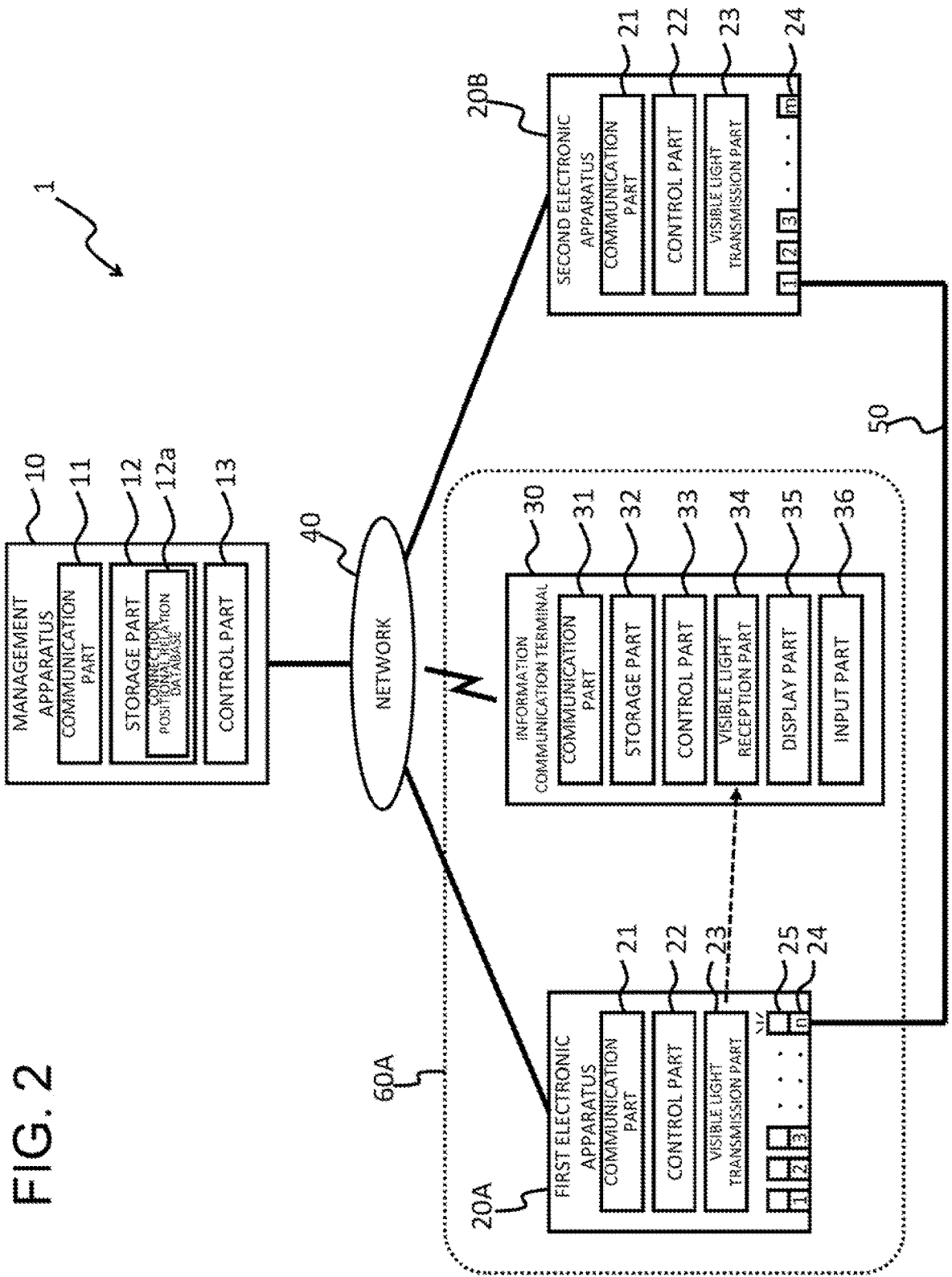
FIG. 2 is an image diagram schematically showing a state where the information communication terminal in the cable erroneous disconnection prevention system according to the first example embodiment exists within a visible light receptible range of a first electronic apparatus.
Figure 3:
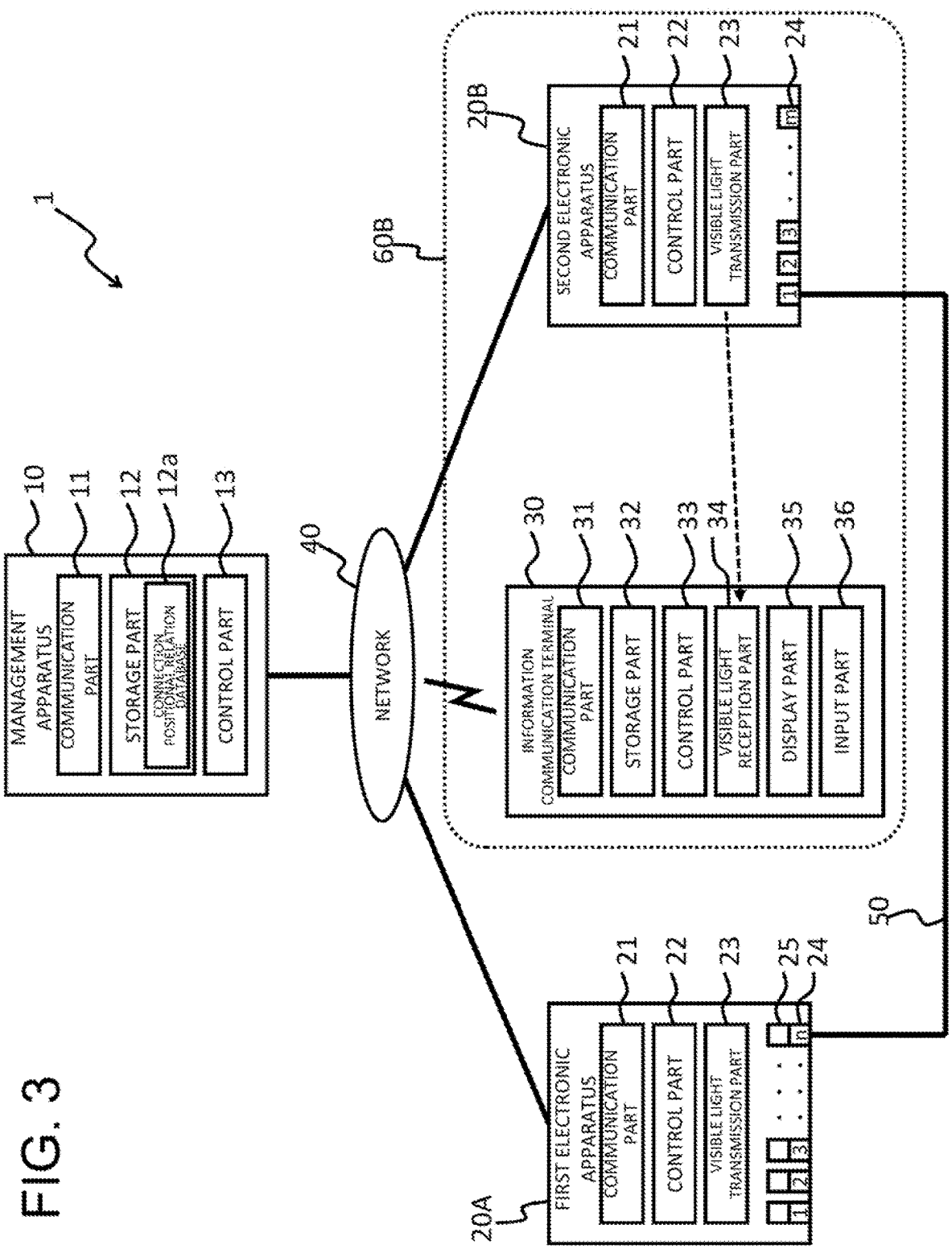
FIG. 3 is an image diagram schematically showing a state where an information communication terminal in the cable erroneous disconnection prevention system according to the first example embodiment exists within a visible light receptible range of a second electronic apparatus.

A cable erroneous disconnection prevention system according to a first example embodiment will be described with reference to the drawings. FIG. 1 is a block diagram schematically showing a configuration of the cable erroneous disconnection prevention system according to the first example embodiment. FIG. 2 is an image diagram schematically showing a state where the information communication terminal in the cable erroneous disconnection prevention system according to the first example embodiment exists within a visible light receptible range of a first electronic apparatus. FIG. 3 is an image diagram schematically showing a state where an information communication terminal in the cable erroneous disconnection prevention system according to the first example embodiment exists within a visible light receptible range of a second electronic apparatus.

The cable erroneous disconnection prevention system 1 is a system for preventing a cable erroneous disconnection (see FIGS. 1 to 3). The cable erroneous disconnection prevention system 1 supports to accurately disconnect a disconnection target cable 50 between the electronic apparatuses 20A and 20B. The cable erroneous disconnection prevention system 1 comprises: a management apparatus 10; a first electronic apparatus 20A; a second electronic apparatus 20B; an information communication terminal 30; a network 40; and a disconnection target cable 50. Although, in FIGS. 1 to 3, the cable erroneous disconnection prevention system 1 is configured to have two electronic apparatuses 20A and 20B, it may be configured to have at least one electronic apparatus.

The management apparatus 10 is an apparatus that manages connection positional relations between cables and each of ports 24 of the electronic apparatuses 20A and 20B (see FIGS. 1 to 3). As the management apparatus 10, for example, a server, a personal computer, an NMS (Network Management System), or the like can be used. The management apparatus 10 comprises: a communication part 11; a storage part 12; and a control part 13.

The communication part 11 is a function part that communicates predetermined information, data, or signals between the management apparatus 10, the electronic apparatuses 20A and 20B, and the information communication terminal 30 (see FIGS. 1 to 3). The communication part 11 is communicably connected to each communication part 21 of the first electronic apparatus 20A and the second electronic apparatus 20B via the network 40. The communication part 11 transmits and receives under a control of the control part 13. As the communication part 11, for example, a network interface such as a LAN (Local Area Network) card, a network adapter, or a network interface card can be used.

The storage part 12 is a function part that stores information such as data, a database, and a program (see FIG. 1). The storage part 12 inputs/outputs information and writes/reads data to/from the connection positional relation database 12a under a control of the control part 13. As the storage part 12, for example, a RAM (Random Access Memory), a hard disk device, an externally connected RAID (Redundant Arrays of Independent Disks) device, or the like can be used, and any storage device may be used. The storage part 12 stores the connection positional relation database 12a as the main information.

The connection positional relation database 12a is a database for managing a connection positional relation of each port 24 of the electronic apparatuses 20A and 20B. The connection positional relation database 12a is managed (newly generated, updated, etc.) by the control part 13. The connection positional relation database 12a associates and stores electronic apparatus names, port names, port position information (images such as figures and photographs may also be used), destination electronic apparatus names, destination port names, and destination port position information (images such as figures and photographs may also be used).

The control part 13 is a function part that controls the communication part 11 and the storage part 12 (see FIGS. 1 to 3). As the control part 13, for example, a unit such as a CPU (Central Processing Unit) or an MPU (Micro Processor Unit) can be used, and not only one unit but also a plurality of units may be used. The control part 13 is electrically connected (or bus connection may be also used) to the communication part 11 and the storage part 12. The control part controls the communication part 11 to transmit and receive information to and from the electronic apparatuses 20A and 20B. The control part 13 inputs/outputs information to/from the storage part 12, and writes/reads data to/from the storage part 12. The control part 13 reads a program stored in the storage part 12, loads it into the main memory, and executes it to perform predetermined information processing.

When the cable is connected to or disconnected from the port 24 of the electronic apparatuses 20A and 20B (when the link is up or down), the control part 13 estimates a connection positional relation (electronic apparatus, port, port position(s), destination electronic apparatus, destination port, destination port position(s)) based on a trap (for example, trap specified in RFC1157, private MIB (Management Information Base), etc.) notified from the electronic apparatuses 20A and 20B. and manages (newly create, update, etc.) the connection positional relation database 12a based on the estimated connection positional relation. As the port position (s) and the destination port position(s), image data such as a figure or a photograph prepared in advance can be used, or image data such as a newly uploaded figure or a photograph can be used.

The control part 13 receives the disconnection target port information (information specifying a disconnection target port) from the information communication terminal 30 or the trap (trap at the time of link down) from the electronic apparatuses 20A and 20B, and specifies (identifies) the disconnection target port based on the received disconnection target port information or the received trap. The control part 13 generates a control signal for blinking the LED 25 of the specified disconnection target port and transmits the generated control signal to the electronic apparatus having the specified disconnection target port. In a case where the electronic apparatus does not have the LED 25 like the electronic apparatus 20B, the generation and transmission of the control signal may be omitted.

The control part 13 reads the information (port name, port position information) related to the specified disconnection target port from the connection positional relation database 12a, and transmits the read information related to the disconnection target port to the electronic apparatus having the specified disconnection target port.

The electronic apparatuses 20A and 20B are electrical products to which electronic engineering technology is applied (see FIGS. 1 to 3). The electronic apparatuses 20A and 20B are configured to have a plurality of ports 24 that can be connected to a cable. As the electronic apparatuses 20A and 20B, for example, a communication apparatus, a network apparatus, an information apparatus, and the like that can be connected to a plurality of cables can be used. The electronic apparatuses 20A and 20B comprise: a communication part 21; a control part 22; a visible light transmission part 23; and a port 24. The first electronic apparatus 20A further comprises an LED 25. Although the second electronic apparatus 20B does not comprise an LED in FIGS. 1 to 3, it may comprise an LED.

The communication part 21 is a function part that transmits/receives predetermined information, data, or signals between the electronic apparatuses 20A and 20B and the management apparatus 10 (see FIGS. 1 to 3). The communication part 21 is communicably connected to the communication part 11 of the management apparatus 10 via the network 40. The communication part 21 communicates under a control of the control part 22. As the communication part 21, for example, a network interface such as a LAN (Local Area Network) card, a network adapter, or a network interface card can be used.

The control part 22 is a function part that controls the communication part 21, the visible light transmission part 23, and the port 24 (see FIGS. 1 to 3). The control part 22 controls the LED 25 in the case of the control part 22 of the first electronic apparatus 20A. As the control part 22, for example, a unit such as a CPU (Central Processing Unit) or an MPU (Micro Processor Unit) can be used, and not only one unit but also a plurality of units may be used. The control part 22 is electrically connected (or bus connection may also be used) to the communication part 21, the visible light transmission part 23, and the ports 24. The control part 22 is electrically connected to the LED 25 in the case of the control part 22 of the first electronic apparatus 20A.

The control part 22 controls the communication part 21 to transmit and receive information to and from the management apparatus 10. In the case of the control part 22 of the first electronic apparatus 20A, the control part 22 performs processing to blink the LED 25 of a disconnection target port (the "n"th port 24 in FIG. 2) based on the control signal from the management apparatus 10. Process as follows. The control part 22 controls the visible light transmission part 23 based on the information (port name, port position information) related to the disconnection target port from the management apparatus 10 and processes to transmit (output) a visible light signal from the visible light transmission part 23.

The control part 22 monitors a cable connection at the port 24. The control part 22 generates a trap (for example, a trap defined by RFC1157, a private MIB (Management Information Base), etc.) when the cable is connected to or disconnected from the port 24 and processes to transmit the generated trap to the management apparatus 10.

The visible light transmission part 23 transmits (outputs) a visible light signal (a signal using an electromagnetic wave in a visible light band) to the outside based on information (port name, port position information) related to the disconnection target port from the management apparatus 10 (see FIGS. 1 to 3). The visible light transmission part 23 transmits visible light under a control of the control part 22. As the visible light transmission part 23, for example, a visible light transmission module using a light source such as a high-speed modulation LED or an organic EL (Electro-Luminescence) can be used.

The port 24 is a portion (for example, a socket) that can be connected to the end (for example, a connector or a terminal) of the cable. The first electronic apparatus 20A has "n" number of ports and the second electronic apparatus 20B has "m" number of ports 24. The ports 24 are electrically connected to the control part 22. The ports 24 are corresponded to the LEDs 25 in the first electronic apparatus 20A.

The LED 25 (note, single form also represents plural form) is a function part that displays (lights up, blinks) a status of the corresponding port 24 in color. The LED 25 displays (lights up, blinks) under a control of the control part 22. The LED 25 is arranged in a vicinity of the corresponding port 24 (including an adjacent position). Although the LED 25 is configured to be had only in the first electronic apparatus 20A in FIGS. 1 to 3, it may be had in the second electronic apparatus 20B as well, and it is possible to be configured not to have it in the first electronic apparatus 20A.

The information communication terminal 30 is a terminal used to specify the port 24 to be disconnected (see FIGS. 1 to 3). As the information communication terminal 30, for example, a tablet terminal, a smartphone, or the like can be used. The information communication terminal 30 is communicably connected to the management apparatus 10 via the network 40. The information communication terminal 30 performs predetermined information processing by executing a program. The information communication terminal 30 comprises: a communication part 31; a storage part 32; a control part 33; a visible light reception part 34; a display part 35; and an input part 36, as main configuration parts.

The communication part 31 is a function part that transmits and receives predetermined information, data, or signals between the information communication terminal 30 and the management apparatus 10 (see FIGS. 1 to 3). The communication part 31 is communicably connected to the communication part 11 of the management apparatus 10 via the network 40. The communication part 31 communicates under a control of the control part 33. As the communication part 31, for example, a wireless communication interface can be used.

The storage part 32 is a function part that stores information such as data, a database, and a program (see FIGS. 1 to 3). The storage part 32 inputs/outputs information and writes/reads data to/from the database under a control of the control part 33. As the storage part 32, for example, a RAM (Random Access Memory), an SSD (Solid State Drive), or the like can be used, and any storage device may be used.

The control part 33 is a function part that controls the communication part 31, the storage part 32, the visible light reception part 34, the display part 35, and the input part 36 (see FIGS. 1 to 3). As the control part 33, for example, a unit such as a CPU (Central Processing Unit) or an MPU (Micro Processor Unit) can be used, and not only one unit but also a plurality of units may be used.

The control part 33 is electrically connected (or bus connection may also be used) to the communication part 31, the storage part 32, the visible light reception part 34, the display part 35, and the input part 36. The control part 33 controls the communication part 31 to transmit and receive information to and from the electronic apparatuses 20A and 20B. The control part 33 inputs/outputs information to/from the storage part 32, and writes/reads data to/from the storage part 32. The control part 33 reads a program stored in the storage part 32, loads it into the main memory, and executes it to perform predetermined information processing.

The control part 33 controls the display part 35 to receive the visible light signal from the visible light transmission part 23 of the electronic apparatuses 20A and 20B, and the visible light reception part 34, and causes the display part 35 to display information (port name, port position information) related to the disconnection target port based on the received visible light signal. The control part 33 controls the input part 36 to take in information input from the input part 36.

The visible light reception part 34 is a function part that receives a visible light signal from the visible light transmission part 23 of the electronic apparatuses 20A and 20B (see FIGS. 1 to 3). As the visible light reception part 34, for example, a visible light reception module using an illuminance sensor, an image sensor, a camera, or the like can be used. The visible light reception part 34 is controlled by the control part 33.

The display part 35 is a function part that displays information (see FIGS. 1 to 3). The display part 35 displays under a control of the control part 33. As the display part 35, for example, a liquid crystal display, an organic EL display, or the like can be used.

The input part 36 is a function part for inputting information (see FIGS. 1 to 3). The input part 36 is controlled by the control part 33, and inputs information by an operation of the user of the information communication terminal 30. As the input part 36, for example, a touch panel, a microphone, or other input means can be used.

The network 40 is an information communication network that communicably connects the management apparatus 10, the electronic apparatuses 20A and 20B, and the information communication terminal 30 (see FIGS. 1 to 3). The network 40 may be an intranet, a local network, or the like, and may include one or both of a wired network and a wireless network.

The disconnection target cable 50 is a cable to be disconnected (i.e., target of disconnection). In FIGS. 1 to 3, although the disconnection target cable 50 is connected between the "n"th port 24 of the first electronic apparatus 20A and the first port 24 of the second electronic apparatus 20B, it is not limited to this. Also, in FIGS. 1 to 3, although only the disconnection target cable 50 is displayed as a cable, a cable may be connected to each of ports 24 of the electronic apparatuses 20A and 20B.

The visible light receptible range 60A is a range in which the visible light signal transmitted from the visible light transmission part 23 of the first electronic apparatus 20A can be received by the visible light reception part 34 of the information communication terminal 30 (see FIG. 2). The visible light receptible range 60B is a range in which the visible light signal transmitted from the visible light transmission part 23 of the second electronic apparatus 20B can be received by the visible light reception part 34 of the information communication terminal 30 (see FIG. 3).

Figure 4:
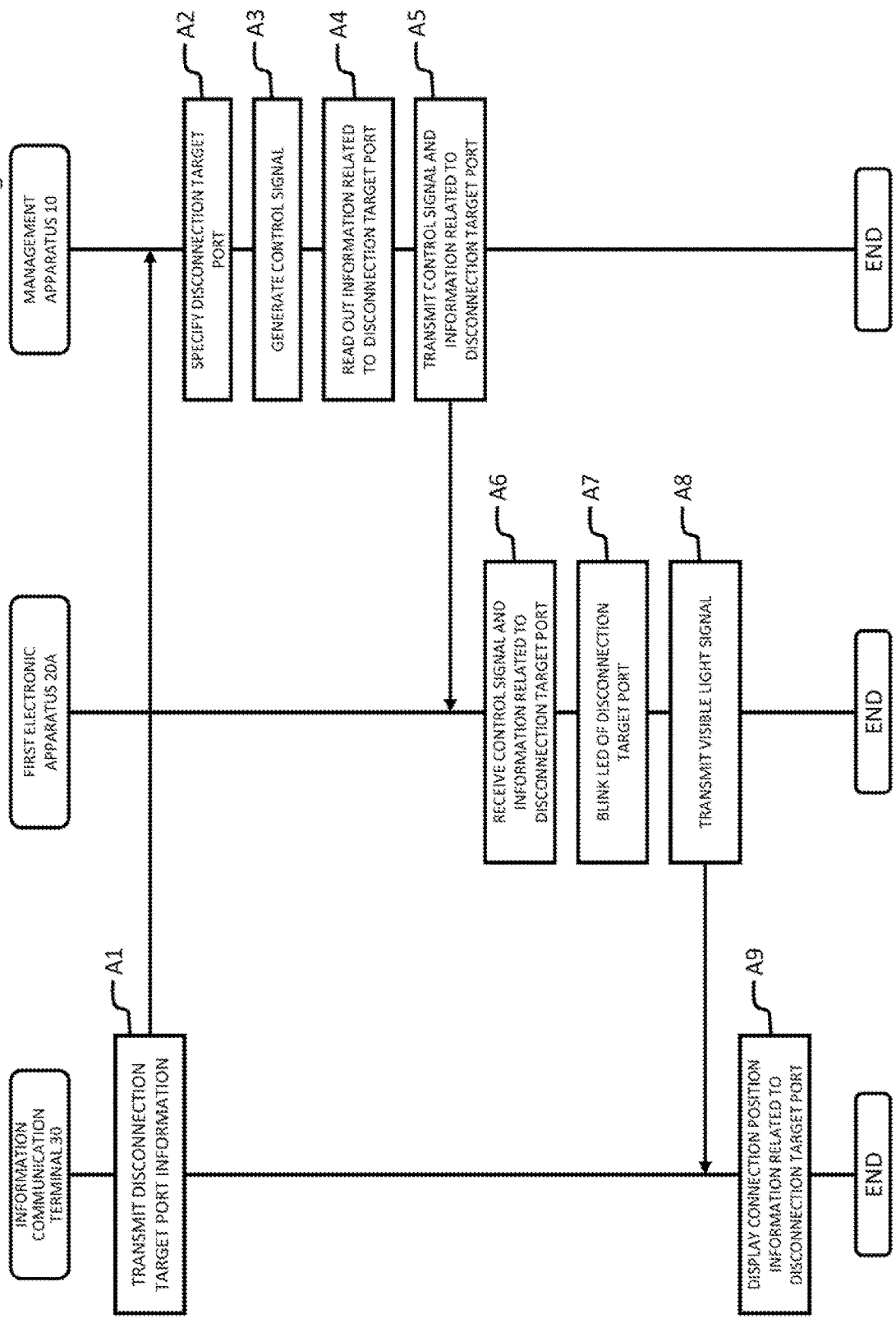
FIG. 4 is a flowchart schematically showing operations before the information communication terminal in the cable erroneous disconnection prevention system according to the first example embodiment disconnects a cable from the first electronic apparatus.
Figure 5:
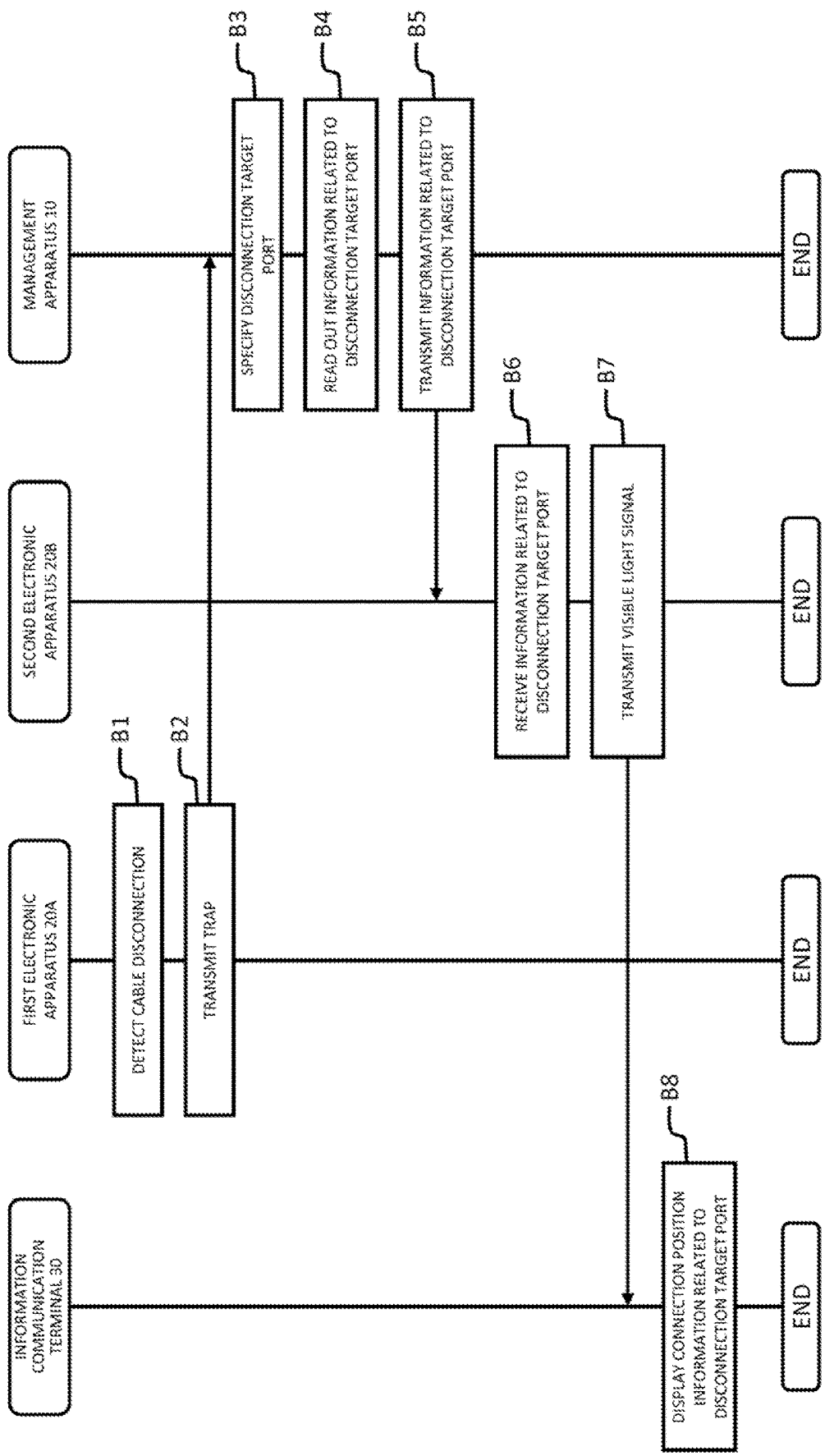
FIG. 5 is a flowchart schematically showing operations before the information communication terminal in the cable erroneous disconnection prevention system according to the first example embodiment disconnects the cable from a second electronic apparatus.

Next, operations of the cable erroneous disconnection prevention system according to the first example embodiment will be described with reference to the drawings. FIG. 4 is a flowchart schematically showing operations before the information communication terminal in the cable erroneous disconnection prevention system according to the first example embodiment disconnects a cable from the first electronic apparatus. FIG. 5 is a flowchart schematically showing operations before the information communication terminal in the cable erroneous disconnection prevention system according to the first example embodiment disconnects the cable from a second electronic apparatus. As to the configuration of the cable erroneous disconnection prevention system 1, please refer to FIGS. 1 to 3.

Operation when the disconnection target cable 50 is disconnected from the first electronic apparatus 20A in a case where the information communication terminal 30 in the cable erroneous disconnection prevention system 1 exists within the visible light receptible range (60A in FIG. 2) of the first electronic apparatus 20A will be described. It is assumed that the disconnection target cable 50 is connected to both the electronic apparatuses 20A and 20B.

First, the information communication terminal 30 transmits disconnection target port information, in which a port name to be disconnected of the electronic apparatus name is directly or indirectly specified, to the management apparatus 10 by an input operation of a user (Step A1 in FIG. 4).

Here, in a case where the disconnection target port can be directly specified in the disconnection target port information, the disconnection target port information in which a name of the disconnection target port is input may be transmitted from the information communication terminal 30 to the management apparatus 10. On the other hand, in a case where the disconnection target port can not be directly specified in the disconnection target port information, the disconnection target port information in which an electronic apparatus name, a destination electronic apparatus name, and a destination port name are input may be transmitted from the information communication terminal 30 to the management apparatus 10. As a result, the management apparatus 10 can estimate a disconnection target port based on the connection positional relation database 12a and use the estimated port name of the disconnection target port as the disconnection target port information.

Next, the management apparatus 10 receives the disconnection target port information and specifies the disconnection target port based on the received disconnection target port information (Step A2 in FIG. 4).

Next, the management apparatus 10 generates a control signal for blinking the LED 25 of the disconnection target port specified in Step A2 (Step A3 in FIG. 4).

Next, the management apparatus 10 reads out the information (port name, port position information) related to the disconnection target port specified in Step A2 from the connection positional relation database 12a (Step A4 in FIG. 4).

Next, the management apparatus 10 transmits the control signal generated in Step A3 and the information (port name, port position information) related to the disconnection target port read out in Step A4 to the first electronic apparatus 20A which has the disconnection target port (Step A5 in FIG. 4).

Next, the first electronic apparatus 20A receives the control signal and the information (port name, port position information) related to the disconnection target port (Step A6 in FIG. 4).

Next, the first electronic apparatus 20A blinks the LED 25 corresponding to the port 24 (the "n"th port 24 in FIG. 2) to be disconnected based on the control signal received in Step A6 (Step A7 in FIG. 4).

Next, the first electronic apparatus 20A transmits a visible light signal from the visible light transmission part 23 to outside based on the information (port name, port position information) related to the disconnection target port received in Step A6 (the visible light transmission part 23) (Step A8 in FIG. 4).

Next, the information communication terminal 30 receives the visible light signal by the visible light reception part 34; displays information (port name, port position information) related to the disconnection target port on the display part 35 based on the received visible light signal (Step A9 in FIG. 4); and then ends. As a result, the user of the information communication terminal 30 can specify the disconnection target port (the "n"th port 24 in FIG. 2) and then disconnect the disconnection target cable 50 from the port.

After that, when the first electronic apparatus 20A detects that the disconnection target cable 50 has been disconnected from the disconnection target port (the "n"th port 24 in FIG. 2) (Step B1 in FIG. 5), the first electronic apparatus 20A transmits a trap (corresponding to the disconnection target port information in which the disconnection target port is directly or indirectly specified) at the time of link down to the management apparatus 10 (Step B2 in FIG. 5).

Next, the management apparatus 10 receives the trap; specifies the disconnection target port based on the received disconnection target port information (Step B3 in FIG. 5); reads out information (port name, port position information) related to the specified disconnection target port (Step B4 in FIG. 5); and transmits the read information (port name, port position information) related to the disconnection target port to the second electronic apparatus 20B having the disconnection target port (Step B5 in FIG. 5).

Next, the second electronic apparatus 20B receives the information (port name, port position information) related to the disconnection target port (Step B6 in FIG. 5), and transmits a visible light signal from the visible light transmission part 23 to outside based on the received information (port name, port position information) related to the disconnection target port (Step B7 in FIG. 5).

Next, the information communication terminal 30 receives the visible light signal by the visible light reception part 34; displays the information (port name, port position information) related to the disconnection target port on the display part 35 based on the received visible light signal (Step B8 in FIG. 5), and then ends. As a result, the user of the information communication terminal 30 can specify the disconnection target port and then disconnect the cable from the port.

According to the first example embodiment, since the disconnection target cable can be specified and then the cable can be disconnected from the port, it is possible to contribute to preventing a cable erroneous disconnection even in a situation where a general cable is used or a plurality of cables are bundled. In particular, as to an optical cable that has a long transmittable distance and is difficult to trace manually, since it is not necessary to manually trace a specific optical cable from one end to the other end, the effect is great. Also, according to the first example embodiment, by blinking the LED 25 corresponding to the port 24 to be disconnected, it is possible to more effectively prevent erroneous disconnection of a cable. Even as to the port 24 without the LED 25, it is possible to prevent erroneous disconnection of a cable by confirming a work target due to an image, a port name, or the like.

Second Example Embodiment

Figure 6:
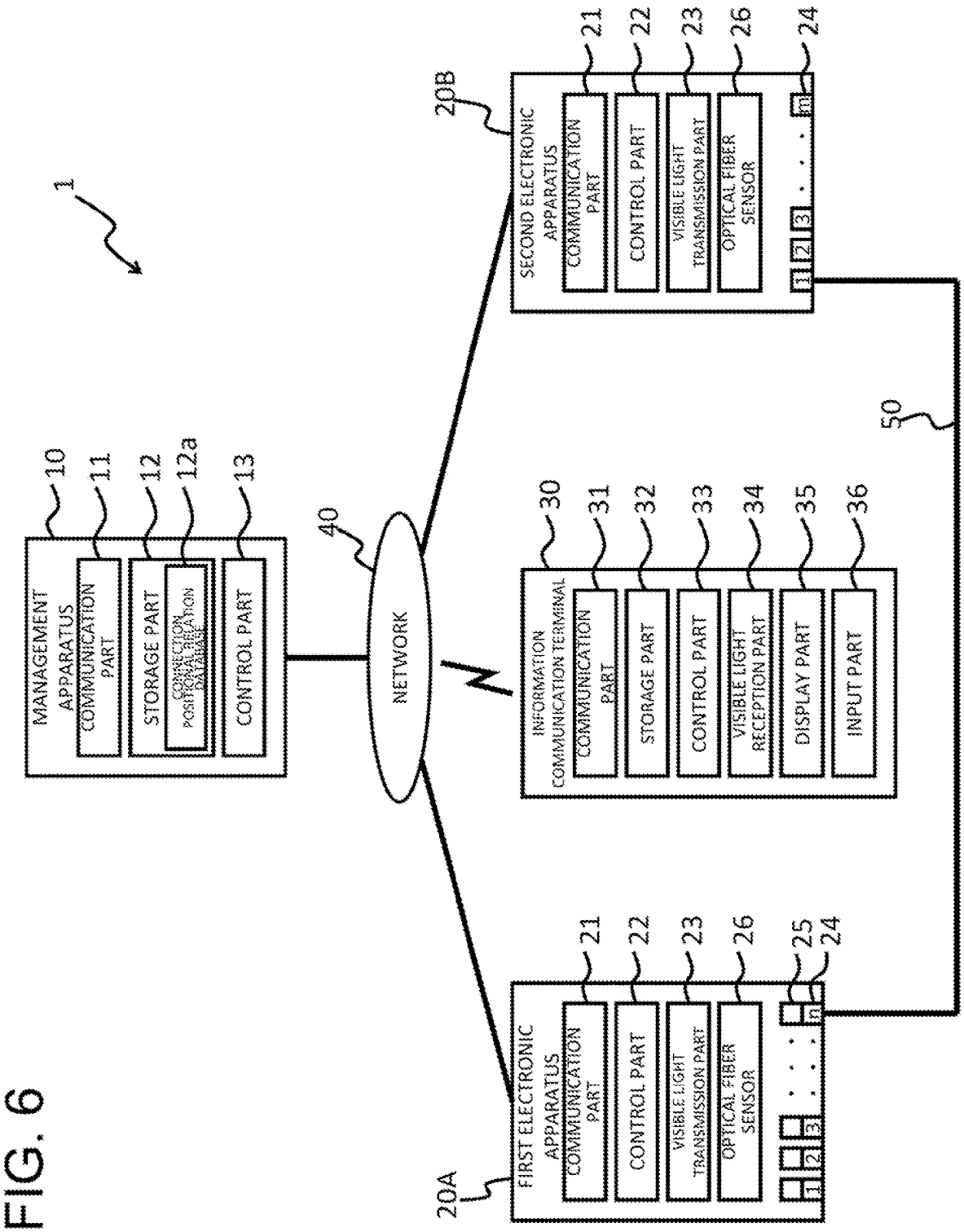
FIG. 6 is a block diagram schematically showing a configuration of a cable erroneous disconnection prevention system according to a second example embodiment.

A cable erroneous disconnection prevention system according to a second example embodiment will be described with reference to the drawings. FIG. 6 is a block diagram schematically showing a configuration of the cable erroneous disconnection prevention system according to the second example embodiment.

The second example embodiment is a modification of the first example embodiment and applies an optical fiber sensing technology. In the cable erroneous disconnection prevention system 1 according to the second example embodiment, an optical fiber sensor 26 is added to the electronic apparatuses 20A and 20B. The optical fiber sensor 26 detects a modulation of light that occurs when vibration is applied to the disconnection target cable 50 which is an optical fiber cable.

In the second example embodiment, instead of transmitting the disconnection target port information from the information communication terminal 30 to the management apparatus 10 in the first example embodiment (Step A1 in FIG. 4 and Step B1 in FIG. 5), the first electronic apparatus 20A (second electronic apparatus 20B may be used) is also acceptable) transmits the disconnection target port information. That is, when applying vibration to the disconnection target cable 50, the control part 22 of the first electronic apparatus 20A specifies the disconnection target port 24 ("n"th port 24 in FIG. 6) connected to the disconnection target cable 50 to which the vibration is applied, based on the modulation of light detected by the optical fiber sensor 26; generates disconnection target port information related to the specified disconnection target port 24; and transmits the generated disconnection target port information to the management apparatus 10.

Other configurations and operations are the same as the first example embodiment.

According to the second example embodiment, similarly to the first example embodiment, since the port 24 to be disconnected can be specified, and then the cable can be disconnected from the port, it is possible to contribute to preventing a cable erroneous disconnection even in a situation where a general cable is used or a plurality of cables are bundled. In particular, it is possible to detect a cable with higher accuracy by applying a simple vibration even on the bundled cable due to the optical fiber sensing technology and specify the port 24 to be disconnected.

Third Example Embodiment

Figure 7:
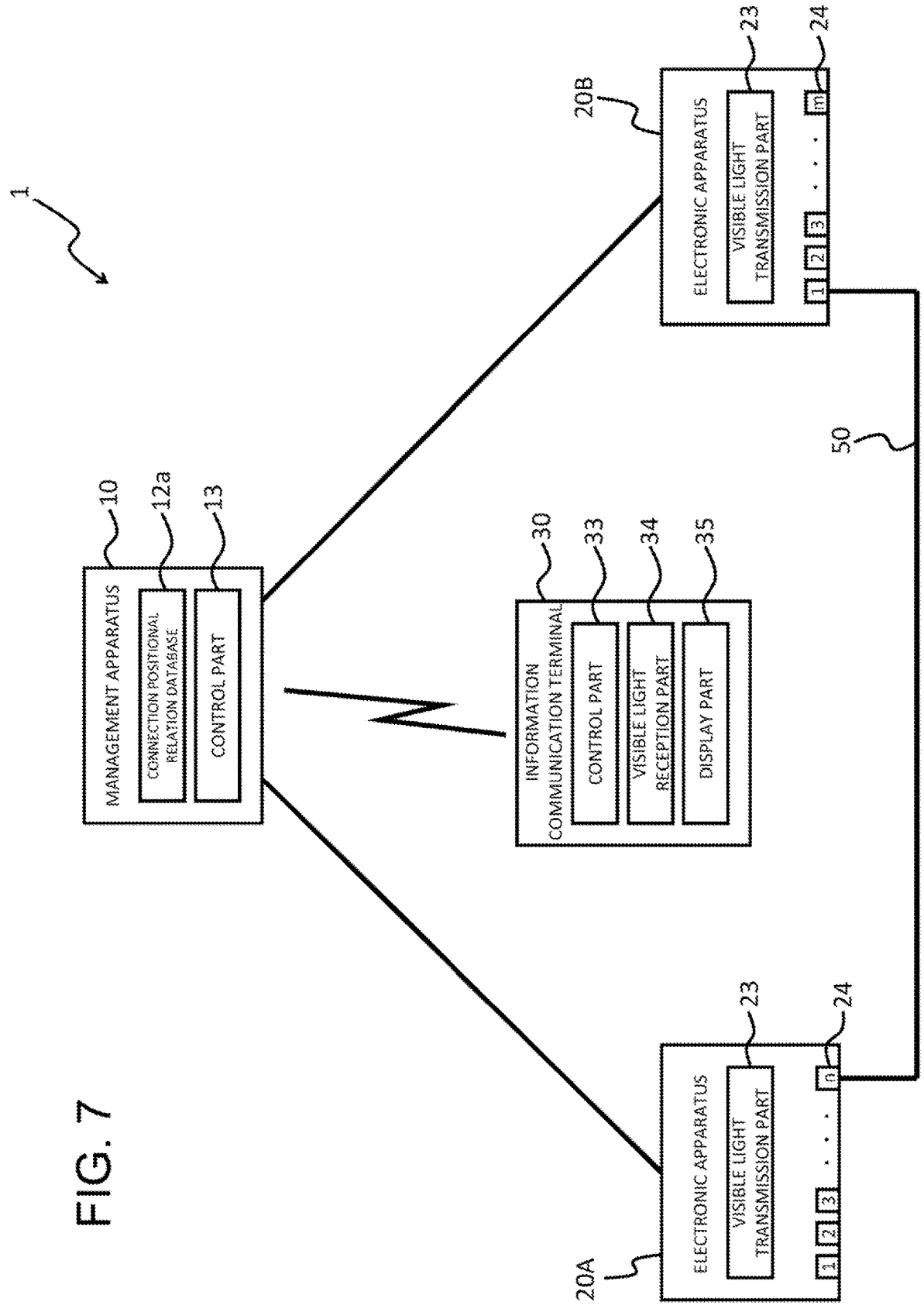
FIG. 7 is a block diagram schematically showing a configuration of a cable erroneous disconnection prevention system according to a third example embodiment.

A cable erroneous disconnection prevention system according to the third example embodiment will be described with reference to the drawings. FIG. 7 is a block diagram schematically showing a configuration of the cable erroneous disconnection prevention system according to the third example embodiment.

The cable erroneous disconnection prevention system 1 is a system for preventing an erroneous disconnection of a disconnection target cable 50 connected to electronic apparatuses 20A and 20B by using the electronic apparatuses 20A and 20B, a management apparatus 10, and an information communication terminal 30.

The electronic apparatuses 20A and 20B each comprise a plurality of ports 24 that can be connected to the disconnection target cable 50. The electronic apparatuses 20A and 20B each have a visible light transmission part 23 that transmits a visible light signal to outside based on a control signal by acquiring the control signal from the management apparatus 10.

The management apparatus 10 is communicably connected to the electronic apparatuses 20A and 20B. The management apparatus 10 has a connection positional relation database 12a for managing the connection positional relation of the ports 24 of the electronic apparatuses 20A and 20B. The management apparatus 10 has a control part 13. The control part 13 acquires a disconnection target port information that directly or indirectly specifies a disconnection target port from which the cable 50 is subject to disconnection, from the information communication terminal 30 or the electronic apparatuses 20A and 20B and thereby specifies a disconnection target port. The control part 13 generates a control signal for controlling the electronic apparatuses 20A and 20B based on the disconnection target port information. The control part 13 transmits the generated control signal to the electronic apparatuses 20A and 20B. by receiving a request from the information communication terminal 30, the control part 13 reads out position information related to a port corresponding to the request, from the connection positional relation database 12a and transmits the position information to the information communication terminal 30.

The information communication terminal 30 is communicably connected to the management apparatus 10. The information communication terminal 30 has a display part 35 that displays information acquired from the management apparatus 10. The information communication terminal 30 has a visible light reception part 34 capable of receiving a visible light signal from the visible light transmission part 23 of the electronic apparatuses 20A and 20B. The information communication terminal 30 has a control part 33 that requests the management apparatus 10 for position information related to the disconnection target port based on the visible light signal by acquiring the visible light signal. The control part 33 acquires the position information related to the port from the management apparatus 10 and thereby causes the display part 35 to display the position information related to the port.

According to the third example embodiment, since the disconnection target cable can be specified and then the cable can be disconnected from the port, it is possible to contribute to preventing a cable erroneous disconnection even in a situation where a general cable is used or a plurality of cables are bundled.

Figure 8:
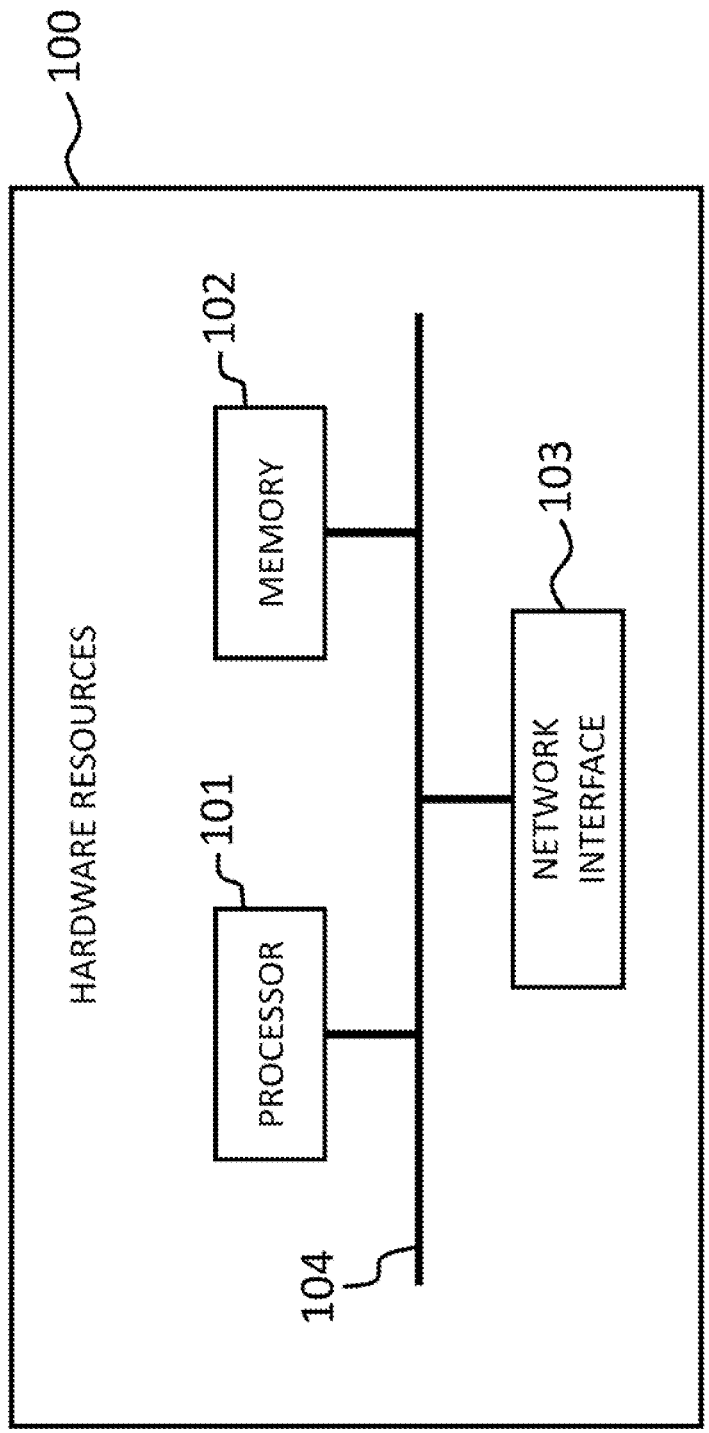
FIG. 8 is a block diagram schematically showing a configuration of hardware resources.

The management apparatus according to the first to third example embodiments can be configured by so-called hardware resources (information processing apparatus, computer), and that having the configuration illustrated in FIG. 8 can be used. For example, the hardware resources 100 comprise: a processor 101; a memory 102; a network interface 103; and the like, which are connected to each other by an internal bus 104.

The configuration shown in FIG. 8 is not intended to limit a hardware configuration of the hardware resources 100. The hardware resources 100 may include hardware (for example, an input/output interface) (not shown). Alternatively, the number of units such as the processor 101 included in the apparatus is not limited to the example of FIG. 8, and for example, a plurality of processors 101 may be included in the hardware resources 100. As the processor 101, for example, a CPU (Central Processing Unit), an MPU (Micro Processor Unit), a GPU (Graphics Processing Unit), or the like can be used.

As the memory 102, for example, a RAM (Random Access Memory), an HDD (Hard Disk Drive), an SSD (Solid State Drive), or the like can be used.

As the network interface 103, for example, a LAN (Local Area Network) card, a network adapter, a network interface card, or the like can be used.

Functions of the hardware resource 100 are realized by the above-mentioned processing module. The processing module is realized, for example, by the processor 101 executing a program stored in the memory 102. Also, the program can be downloaded via a network or updated using a storage medium in which the program is stored. Further, the processing module may be realized by a semiconductor chip. That is, the functions performed by the processing module may be realized by executing software on some hardware.

Part or all of the above example embodiments may be described as the following MODES, but is not limited to the following.

[Mode 1]

A cable erroneous disconnection prevention system comprising: electronic apparatuses each comprising a plurality of ports that can be connected to a cable;
  a management apparatus that is communicably connected to the electronic apparatuses and comprises a connection positional relation database for managing connection positional relations of the ports of the electronic apparatuses; and
  an information communication terminal that is communicably connected to the management apparatus and comprises a display part that displays information acquired from the management apparatus,
  wherein the management apparatus comprises a control part that processes to: acquire disconnection target port information that directly or indirectly identifies a disconnection target port from which a cable is subjected to disconnection, from the information communication terminal or the electronic apparatus; thereby identify the disconnection target port based on the disconnection target port information; read information related to the specified disconnection target port from the connection positional relation database; and transmit the read information related to the disconnection target port to the electronic apparatus,
  wherein the electronic apparatus comprises a visible light transmission part that transmits a visible light signal to outside based on the information related to the disconnection target port by acquiring the information related to the disconnection target port from the management apparatus, and
  wherein the information communication terminal comprises a visible light reception part that can receive the visible light signal from the visible light transmission part of the electronic apparatus and causes the display part to display the information related to the disconnection target port based on the visible light signal by acquiring the visible light signal.

[Mode 2]

The cable erroneous disconnection prevention system according to MODE 1,
  wherein the control part of the management apparatus generates a control signal for blinking a light emitting element of the specified disconnection target port and transmits the generated control signal to the electronic apparatus, and
  wherein the electronic apparatus comprises a light emitting element corresponding to the port and blinking based on the control signal by acquiring the control signal from the management apparatus.

[Mode 3]

The cable erroneous disconnection prevention system according to MODE 1 or 2, wherein the disconnection target port information is information input by the information communication terminal or a trap at the time of link down from the electronic apparatus.

[Mode 4]

The cable erroneous disconnection prevention system according to MODE 1 or 2,
  wherein the cable is an optical fiber cable,
  wherein the electronic apparatus comprises: an optical fiber sensor that detects a modulation of light generated when adding vibration to the optical fiber cable connected to the port; and a control part, and
  wherein the control part processes to: identify a port connected to the optical fiber cable to which vibration is added based on the modulation of light detected by the optical fiber sensor; generate the disconnection target port information related to the identified port; and transmit the generated disconnection target port information to the management apparatus.

[Mode 5]

The cable erroneous disconnection prevention system according to any one of MODES 1 to 4,
  wherein in the connection positional relation database, an electronic apparatus name, a port name, port position information, a destination electronic apparatus name, a destination port name, and destination port position information are associated with each other, and
  wherein the information related to the disconnection target port includes a port name and port position information.

[Mode 6]

The cable erroneous disconnection prevention system according to MODE 5, wherein the port position information includes image data of a port.

[Mode 7]

The cable erroneous disconnection prevention system according to any one of MODES 1 to 6,
  wherein the disconnection target port information is information in which the port name is input, or information in which an electronic apparatus name, a destination electronic apparatus name, and a destination port name are input, and
  wherein the control part of the management apparatus identifies the disconnection target port by using the connection positional relation database in a case where the disconnection target port information is information in which an electronic apparatus name, a destination electronic apparatus name, and a destination port name are input.

[Mode 8]

A management apparatus in a cable erroneous disconnection prevention system comprising:
  electronic apparatuses each comprising a plurality of ports that can be connected to a cable;
  the management apparatus that is communicably connected to the electronic apparatuses and comprises a connection positional relation database for managing connection positional relations of the ports of the electronic apparatuses; and
  an information communication terminal that is communicably connected to the management apparatus and comprises a display part that displays information acquired from the management apparatus,
  wherein the management apparatus comprises a control part, and wherein the control part executes processings of:
  acquiring disconnection target port information that directly or indirectly identifies a disconnection target port from which a cable is subjected to disconnection, from the information communication terminal or the electronic apparatus;
  thereby identifying the disconnection target port based on the disconnection target port information;
  reading information related to the specified disconnection target port from the connection positional relation database; and
  transmitting the read information related to the disconnection target port to the electronic apparatus.

[Mode 9]

A cable erroneous disconnection prevention method performed in a cable erroneous disconnection prevention system comprising:
  electronic apparatuses each comprising a plurality of ports that can be connected to a cable;
  a management apparatus that is communicably connected to the electronic apparatuses and comprises a connection positional relation database for managing connection positional relations of the ports of the electronic apparatuses; and
  an information communication terminal that is communicably connected to the management apparatus and comprises a display part that displays information acquired from the management apparatus,
  wherein the method comprises:
  in the management apparatus, acquiring disconnection target port information that directly or indirectly identifies a disconnection target port from which a cable is subjected to disconnection, from the information communication terminal or the electronic apparatus;
  in the management apparatus, thereby identifying the disconnection target port based on the disconnection target port information;
  in the management apparatus, reading information related to the specified disconnection target port from the connection positional relation database;
  in the management apparatus, transmitting the read information related to the disconnection target port to the electronic apparatus;
  in the electronic apparatus, transmitting a visible light signal to outside based on the information related to the disconnection target port by acquiring the information related to the disconnection target port from the management apparatus; and
  in the information communication terminal, causing to display the information related to the disconnection target port based on the visible light signal by acquiring the visible light signal from the electronic apparatus.

[Mode 10]

A program executed by a management apparatus in a cable erroneous disconnection prevention system comprising:
  electronic apparatuses each comprising a plurality of ports that can be connected to a cable;
  the management apparatus that is communicably connected to the electronic apparatuses and comprises a connection positional relation database for managing connection positional relations of the ports of the electronic apparatuses; and
  an information communication terminal that is communicably connected to the management apparatus and comprises a display part that displays information acquired from the management apparatus,
  wherein the program causes the management apparatus to execute processings of:

acquiring disconnection target port information that directly or indirectly identifies a disconnection target port from which a cable is subjected to disconnection, from the information communication terminal or the electronic apparatus;

thereby identifying the disconnection target port based on the disconnection target port information;

reading information related to the specified disconnection target port from the connection positional relation database; and transmitting the read information related to the disconnection target port to the electronic apparatus.

It should be noted that each disclosure of the above PTLs shall be incorporated and described herein by reference and can be used as a basis or a part of the present invention as necessary. Within a framework of the entire disclosure of the present invention (including claims and drawings), it is possible to modify or adjust the example embodiments or examples further based on the basic technical concept thereof. Also, within the framework of entire disclosure of the present invention, various combinations or selections (non-selection if necessary) of various disclosed elements (including each element of each claim, each element of each example embodiment or example, each element of each drawing, etc.) is possible. That is, it goes without saying that the present invention includes various deformations and modifications that can be made by one skilled in the art in accordance with all disclosures including claims and drawings, and the technical concept. Further, as to the numerical values and numerical ranges described in the present application, it is considered that arbitrary intermediate values, lower numerical values, and small ranges are described even if not explicitly recited. Furthermore, it is also considered that a matter used to combine part or all of each of the disclosed matters of the above-cited documents with the matters described in this document as a part of the disclosure of the present invention, in accordance with the gist of the present invention, if necessary, is included in the disclosed matters of the present application.

REFERENCE SIGNS LIST

1 Cable erroneous disconnection prevention system
10 Management apparatus
11 Communication part
12 Storage part
12a Connection positional relation database
13 Control part
20A First electronic apparatus (electronic apparatus)
20B Second electronic apparatus (electronic apparatus)
21 Communication part
22 Control part
23 Visible light transmission part
24 Port
25 LED
26 Optical fiber sensor
30 Information communication terminal
31 Communication part
32 Storage part
33 Control part
34 Visible light reception part
35 Display part
36 Input part
40 Network
50 Disconnection target cable
60A, 60B Visible light receptible range
100 Hardware resources
101 Processor
102 Memory
103 Network interface
104 Internal bus

What is claimed is:

1. A cable erroneous disconnection prevention system comprising:

electronic apparatuses that each comprise a plurality of ports that can be connected to a cable;

a management apparatus that is communicably connected to the electronic apparatuses and comprises a memory storing instructions, a processor, and a connection positional relation database for managing connection positional relations of the ports of the electronic apparatuses; and an information communication terminal that is communicably connected to the management apparatus and comprises a display that displays information acquired from the management apparatus, wherein processor of the management apparatus is configured to execute the instructions to:

acquire disconnection target port information that directly or indirectly identifies a disconnection target port from which a cable is subjected to disconnection, from the information communication terminal to identify the disconnection target port based on the disconnection target port information;

read information related to the identified disconnection target port from the connection positional relation database; and transmit the read information related to the disconnection target port to the electronic apparatus, wherein the electronic apparatus comprises a visible light transmission part that transmits a visible light signal to outside of the electronic apparatus based on the information related to the disconnection target port transmitted by the management apparatus, and wherein the information communication terminal comprises a visible light reception part that receives the visible light signal from the electronic apparatus and causes the display to display the information related to the disconnection target port based on the visible light signal that has been received, wherein the cable is an optical fiber cable, wherein the electronic apparatus comprises a memory storing instructions, a processor, and an optical fiber sensor that detects a modulation of light generated when adding vibration to the optical fiber cable connected, and wherein the processor of the electronic apparatus is configured to execute the instructions to:

identify a port connected to the optical fiber cable to which the vibration is added based on the modulation of light detected by the optical fiber sensor;

generate the disconnection target port information related to the identified port; and transmit the generated disconnection target port information to the management apparatus.

2. The cable erroneous disconnection prevention system according to claim 1, wherein in the connection positional relation database, an electronic apparatus name, a port name, port position information, a destination electronic apparatus name, a destination port name, and destination port position information are associated with each other, and wherein the information related to the disconnection target port includes the port name and the port position information.

3. The cable erroneous disconnection prevention system according to claim 2, wherein the port position information includes port image data.

4. The cable erroneous disconnection prevention system according to claim 1,
wherein the disconnection target port information is information in which a port name is input, or information in which an electronic apparatus name, a destination electronic apparatus name, and a destination port name are input, and
wherein the processor of the management apparatus is configured to execute the instructions to identify the disconnection target port by using the connection positional relation database in a case where the disconnection target port information is information in which the electronic apparatus name, the destination electronic apparatus name, and the destination port name are input.

5. A cable erroneous disconnection prevention system comprising:
electronic apparatuses that each comprise a plurality of ports that can be connected to a cable;
a management apparatus that is communicably connected to the electronic apparatuses and comprises a memory storing instructions, a processor, and a connection positional relation database for managing connection positional relations of the ports of the electronic apparatuses; and
an information communication terminal that is communicably connected to the management apparatus and comprises a display that displays information acquired from the management apparatus,
wherein processor of the management apparatus is configured to execute the instructions to:
acquire disconnection target port information that directly or indirectly identifies a disconnection target port from which a cable is subjected to disconnection, from the information communication terminal to identify the disconnection target port based on the disconnection target port information;
read information related to the identified disconnection target port from the connection positional relation database; and
transmit the read information related to the disconnection target port to the electronic apparatus,
wherein the electronic apparatus comprises a visible light transmission part that transmits a visible light signal to outside of the electronic apparatus based on the information related to the disconnection target port transmitted by the management apparatus,
wherein the information communication terminal comprises a visible light reception part that receives the visible light signal from the electronic apparatus and causes the display to display the information related to the disconnection target port based on the visible light signal that has been received,
wherein the processor of the management apparatus is configured to execute the instructions to generate a control signal for blinking a light emitting element of the identified disconnection target port and transmit the generated control signal to the electronic apparatus,
wherein the electronic apparatus comprises a light emitting element corresponding to the identified disconnection target port and blinks the light emitting element based on the control signal transmitted by the management apparatus,
wherein the cable is an optical fiber cable,
wherein the electronic apparatus comprises a memory storing instructions, a processor, and an optical fiber sensor that detects a modulation of light generated when adding vibration to the optical fiber cable connected, and
wherein the processor of the electronic apparatus is configured to execute the instructions to:
identify a port connected to the optical fiber cable to which the vibration is added based on the modulation of light detected by the optical fiber sensor;
generate the disconnection target port information related to the identified port; and
transmit the generated disconnection target port information to the management apparatus.

* * * * *